(12) United States Patent
Chou

(10) Patent No.: US 7,434,978 B2
(45) Date of Patent: Oct. 14, 2008

(54) BACKLIGHT MODULE

(75) Inventor: Shen-Hong Chou, Miao Li Hsien (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/514,839

(22) Filed: Sep. 5, 2006

(65) Prior Publication Data

US 2007/0053176 A1 Mar. 8, 2007

(30) Foreign Application Priority Data

Sep. 6, 2005 (TW) .............................. 94130595 A

(51) Int. Cl.
*F21V 7/04* (2006.01)
(52) U.S. Cl. .................. 362/631; 362/612; 362/634
(58) Field of Classification Search .................. 362/620, 362/630, 631, 633, 632, 612, 634
See application file for complete search history.

(56) References Cited

U.S. PATENT DOCUMENTS 5,867,149 A * 2/1999 Jaeger ..................... 345/172
6,036,336 A * 3/2000 Wu ........................ 362/249

* cited by examiner

*Primary Examiner*—John A Ward
(74) *Attorney, Agent, or Firm*—Birch, Stewart, Kolasch & Birch, LLP

(57) ABSTRACT

A backlight module comprises a bezel, an LED circuit board, an LED, and a driving circuit board. The bezel has a hole and the LED circuit board is disposed on the bezel and includes a first surface and a second surface. There is a first connector disposed on the second surface and passing through the hole of the bezel. The LED is welded on the second surface of the LED circuit board, an emitting end of the LED is protruded outside the first surface. The driving circuit board has a second connector, the second connector is connected to the fist connector so as to transmit signals to the LED circuit board.

10 Claims, 3 Drawing Sheets

BACKLIGHT MODULE

FIELD OF THE INVENTION

The present invention generally relates to a backlight module, more particularly to a backlight module being conveniently assembled.

DESCRIPTION OF THE PRIOR ART

Liquid crystal displays (LCDs) are previously applied to the portable electronic products as notebook PC, mobile phone, digital camera, digital video machine or personal digital assistant (PDA), etc. The two main elements are a LCD panel and a backlight module. The LCD panel comprises ITO, liquid crystal layer, an alignment layer, color filters, and a polarizer; the backlight module comprises a light source, a light guide, lens, a diffusion plate, a reflection plate, and other optical films. Every element within the backlight module influences the quality and emitting efficiency of the LCD.

The light source applied in the backlight module includes cold cathode fluorescent lamps (CCFLs), external electrode fluorescent lamps (EEFLs), or light emitting diodes (LEDs). Among those light sources, the LED has advantages of small size, long lifetime, low driving voltage, etc, hence applying LED as light source of the backlight module is more and more common.

A driving circuit board within the backlight module is used to control the power for the light source so as to cause the high operating temperature of the driving circuit board. Thus the driving circuit board is usually disposed on a back of the backlight module to prevent that the high-temperature effect affects the LCD. Hence, the circuits in both the driving circuit board and the light source of the backlight module may be connected each other by many types of connections.

However, in practice, using wires to connect has the disadvantages of wiring complex, inconvenient assembling, hard to fix wires, etc.

Moreover, many types of LED modules or LEDs increase the complexity and difficulties while designing and assembling the connecting wires of the backlight module, such as wire layout, connecting types.

Hence, to solve the wire-connection problem and enhance the fabricating efficiency of the LCD may be an important issue to the persons skilled in the art.

SUMMARY OF THE INVENTION

The present invention discloses a backlight module comprises a bezel, an LED circuit board, an LED, and a driving circuit board. The bezel has a hole and the LED circuit board is disposed on the bezel and includes a first surface and a second surface. There is a first connector disposed on the second surface and passing through the hole of the bezel. The LED is welded on the second surface of the LED circuit board, an emitting end of the LED is protruded outside the first surface. The driving circuit board has a second connector, the second connector is connected to the fist connector so as to transmit signals to the LED circuit board. Herein the first connector is female-connected to a second connector on the driving circuit board.

To sum up, the LED circuit board and the driving circuit board of the present invention are electrically connected each other via the connection of the first connector and the second connector, hence conducting wires are no longer exist. Besides, the design to fix the conducting wires and the layout of the conducting wires shall not be considered either so as to reduce the space occupied by the conducting wires. It is the merit of increasing design flexibility.

All the spirits and scope of the present invention will be understood by the detail and illustration described in following.

BRIEF DESCRIPTION OF THE DRAWINGS

Other features and advantages of this invention will become more apparent in the following detailed description of the preferred embodiments of this invention, with reference to the accompanying drawings, in which.

DESCRIPTION OF THE PREFERRED EMBODIMENT

Figure 1:
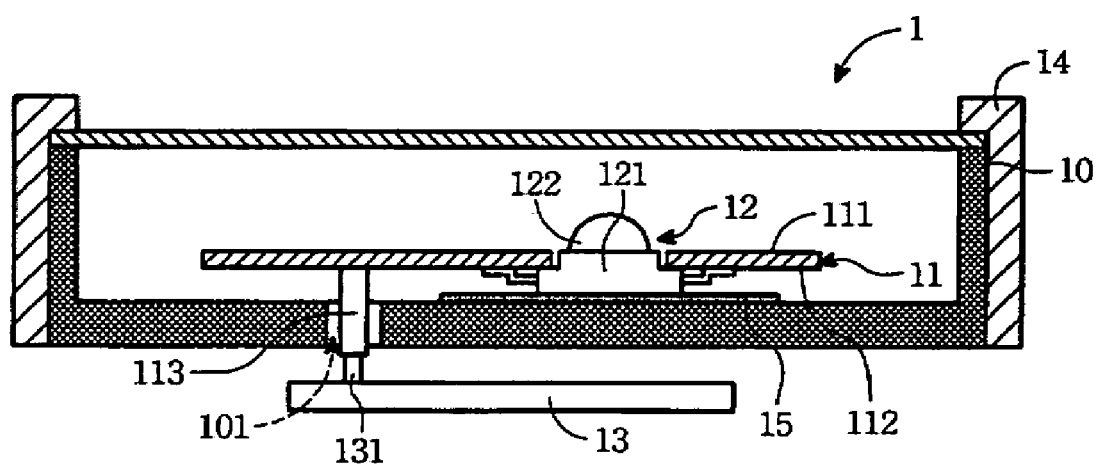
FIG. 1A illustrating a schematic side view of a preferred embodiment of a backlight module of the present invention.
FIG. 1B illustrating a schematic exploded view of a plurality of primary elements of FIG. 1A.
Figure 1B:
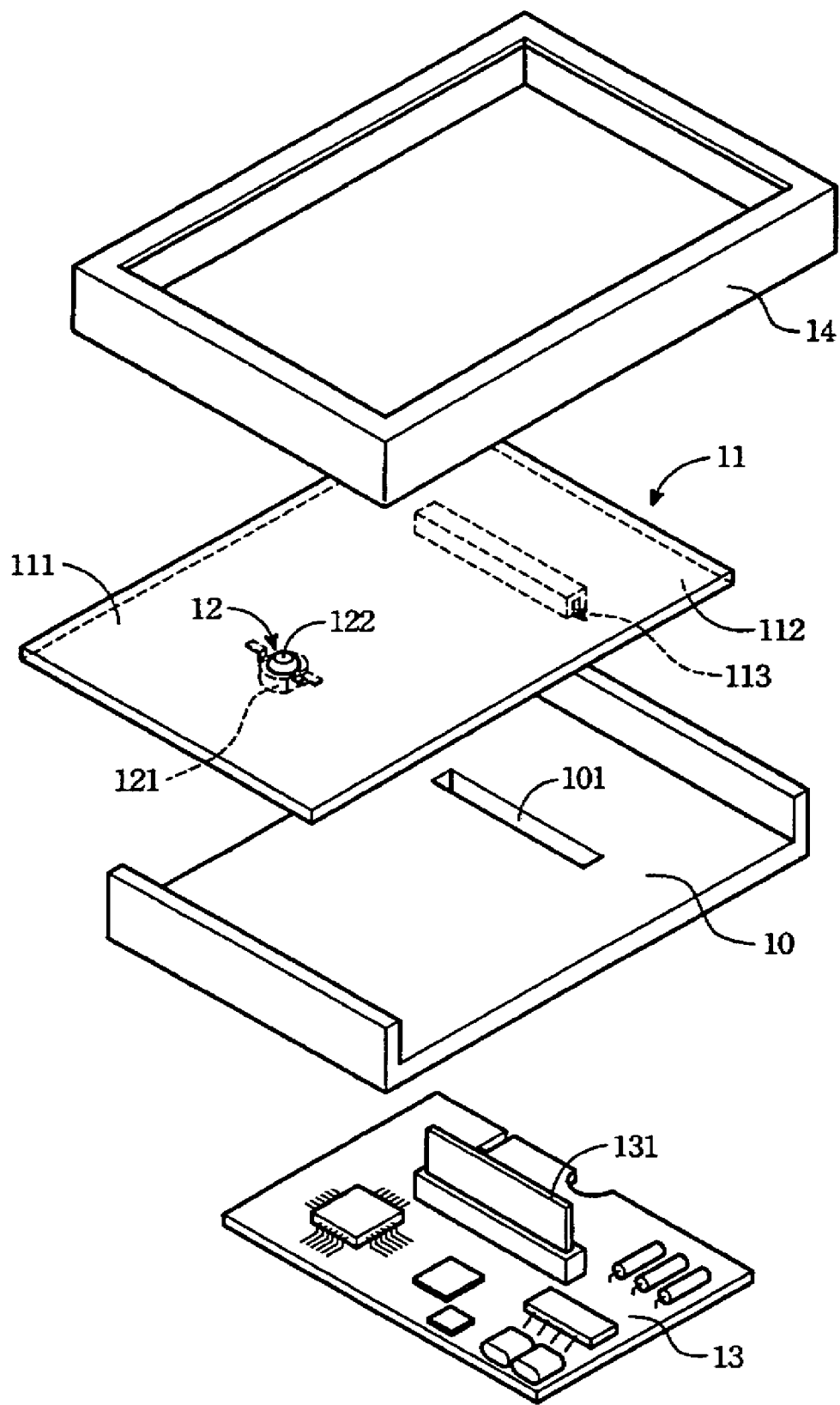

Please refer to FIG. 1A, which illustrates a schematic side view of a preferred embodiment of a backlight module of the present invention. Referring to FIG. 1B, which illustrates a schematic exploded view of a plurality of primary elements of FIG. 1A. In the embodiment, the backlight module 1 includes a bezel 10, an LED circuit board 11, an LED 12, and a driving circuit board 13.

The bezel 10 has periphery walls to form a shallow trough. The bezel 10 is made of Aluminum (Al), plastics, or other types of materials. The backlight module 1 has a frame 14 assembled with the bezel 10 to accommodate the LED circuit board 11, the LED 12 or other optical elements as diffuser, reflection plate, etc. The bezel 10 further has a through hole 101 for the embodiment.

The LED circuit board 11 is a substrate for laying different kinds of circuits, such as a PCB, and includes a first surface 111 and a second surface 112 corresponding to the first surface 111. In a preferred embodiment, as shown in FIG. 1A and FIG. 1B, the second surface 112 further has a first connector 113 directly formed thereon. More concretely, the second surface 112 of the LED circuit board 11 is a surface full of conducting wires, and the first connector 113 is a socket or a plug. In the embodiment, the first connector 113 is a socket welded directly on the second surface 112.

The LED circuit board 11 is disposed on the bezel 10 and sandwiched in between the bezel 10 and the frame 14. The second surface 112 of the LED circuit board 11 faces to the bezel 10, and the first connector 113 passes through the bezel 10 via the hole 101.

The LED 12 is lodged in the LED circuit board 11 and electrically connected to the first connector 113. The LED 12 is divided into a base 121 and an emitting end 122. A plurality of pins of the base 121 are welded on the first surface 111 or the second surface 112 to conduct electricity and emit light from the emitting end 122 through the electric signals received by the first connector 113.

Herein the design of the base 121 welding on the second surface 112 is especially suitable to the first connector 113. The base 121 and the first connector 113 are disposed on the first surface 111 and the second surface 112 respectively, the LED circuit board 11 has to be a multi-layer circuit board or dual circuit board, then electrically connects to the first surface 111 and the second surface 112 through a conducting hole. This process is more complicate. In another word, under a better situation, the base 121 and the first connector 113 are on the same laying surface. In the present embodiment, the base 121 is welded on the second surface 112 of the LED circuit board 11, and the first connector 113 is disposed on the second surface 112 as well.

The circuits within the base 121 are the primary heat source of the LED 12 as always. In some embodiments, the base 121 and the emitting end 122 are disposed on two opposite sides of the LED circuit board 11 respectively for avoiding the heat from the base 121 affecting the emitting efficiency of the backlight module. In better embodiments, there is a thermal conducting film disposed between the bezel 10 and the LED 12 for conducting the heat into the bezel 10.

Hence, the base 121 of the present invention is welded on the second surface 112. The aforesaid embodiment of the LED 12 lodged in the LED circuit board 11 could be varied. Please also refer to FIG. 2, FIG. 3, and FIG. 4, the embodiments shall mainly take the LED as examples; on the other hand, such backlight module can have a plurality of LEDs, not be restricted only one LED in practice.

Figure 2:
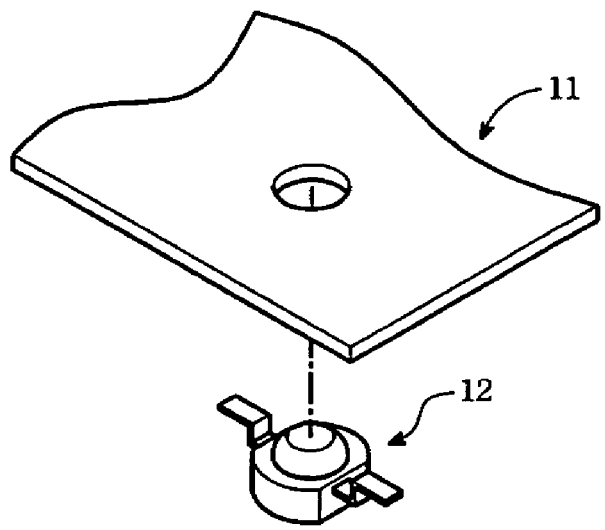
FIG. 2-FIG. 4 illustrating schematic views of different embodiments of an LED lodged into an LED circuit board of the present invention.

Please refer to FIG. 2, there is a hole on the LED circuit board 11 for accommodating the LED 12.

Figure 3:
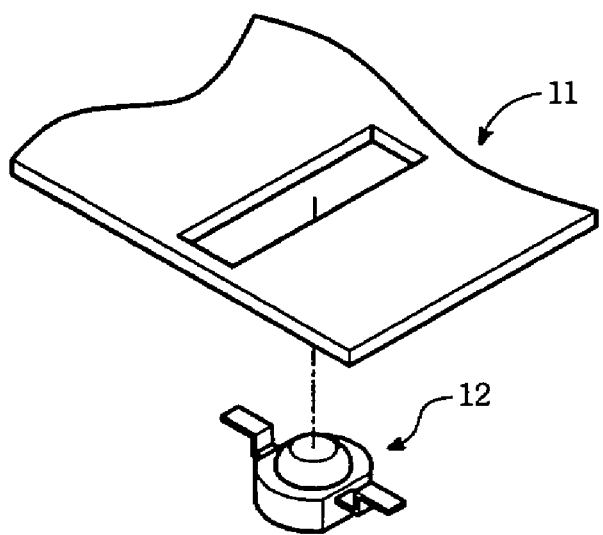

In FIG. 3, there is a trough on the LED circuit board 11 for accommodating the LED 12.

Figure 4:
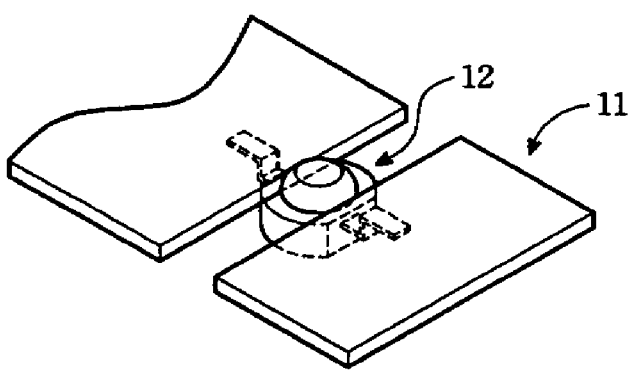

In FIG. 4, the LED circuit board 11 includes two sub-circuit boards, the LED 12 is sandwiched in between the two sub-circuit boards for holding.

With reference to FIG. 1A and FIG. 1B, the driving circuit board 13 includes a power driving chip, which may control the power supply of the LED 12 so as to start the backlight module 1. The first connector 113 is female-connected to a second connector 131 which is directly formed on the driving circuit board 13 in the preferred embodiment. In the embodiment, please refer to FIG. 1A and FIG. 1B again, the first connector 113 is a socket and the second connector 131 is a protruding plug, the second connector 131 could be plugged into the first connector 113.

The LED circuit board and the driving circuit board of the present invention are electrically connected each other via the connection of the first connector and the second connector, hence conducting wires are no longer exist. Besides, the design to fix the conducting wires and the layout of the conducting wires shall not be considered either so as to reduce the space occupied by the conducting wires. It is the merit of increasing design flexibility.

The assembling process of the backlight module comprises the steps of:

firstly, lodging the LED 12 in the LED circuit board 11;

letting the first connector 113 be through the hole 101 and mounting the LED circuit board 11 on the bezel 10; and positioning the driving circuit board 13 corresponding to the position of the first connector 113 and electrically lodging the second connector 131 of the driving circuit board 13 into the LCD circuit board 11 so as to connect the driving circuit board 13 and the LCD circuit board 11.

From above description, we can see that the assembling processes of the backlight module disclosed herein are very simple and convenient. That is, to lodge the second connector of the driving circuit board into the LCD circuit board according to the position of the first connector may finish the assembly. Moreover, the driving circuit board is positioned as well.

What is claimed is:

1. A backlight module comprising:
    a bezel having a hole;
    a light emitting diode (LED) circuit board, disposed on the bezel, having a first surface and a second surface;
    a first connector disposed on the second surface of the LED circuit board and passing through the hole of the bezel;
    an LED welded on the second surface of the LED circuit board, an emitting end of the LED being protruded outside the first surface; and
    a driving circuit board having a second connector, the second connector being connected to the fist connector so as to transmit signals to the LED circuit board.

2. The backlight module of claim 1, wherein the first connector is a socket protruding outward from the second surface of the LED circuit board.

3. The backlight module of claim 1, wherein the second connector is a plug protruding outward from the surface of the driving circuit board.

4. A backlight module comprising:
    a bezel having a hole;
    an LED circuit board, disposed on the bezel, having a first surface and a second surface;
    a first connector disposed on the second surface of the LED circuit board and passing though the hole of the bezel;
    an LED disposed on the LED board and electrically connected to the first connector; and
    a driving circuit board having a second connector connected to the first connector.

5. The backlight module of claim 4, wherein the LED circuit board further has an opening, and the LED is embedded in the opening.

6. The backlight module of claim 4, wherein the first connector is a socket protruding outward from the second surface of the LED circuit board.

7. The backlight module of claim 4, wherein the second connector is a plug protruding outward from the surface of the driving circuit board.

8. The backlight module of claim 4, wherein the bezel is made of aluminum.

9. The backlight module of claim 4, further comprising a frame assembled with the bezel for accommodating the LED circuit board and the LED.

10. The backlight module of claim 4, further comprising a thermal conducting film disposed between the bezel and the LED.

* * * * *